(12) United States Patent
Paolella et al.

(10) Patent No.: US 10,754,113 B1
(45) Date of Patent: Aug. 25, 2020

(54) OPTO-ELECTRONIC DEVICE INCLUDING ACTIVE CIRCUIT COMPONENT ON CIRCUIT ATTACHMENT AREA OF OPTICAL FIBER AND RELATED METHODS

(71) Applicant: Eagle Technology, LLC, Melbourne, FL (US)

(72) Inventors: Arthur C. Paolella, Indian Harbour Beach, FL (US); Christopher D. Fisher, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 16/542,857

(22) Filed: Aug. 16, 2019

(51) Int. Cl.
| | | |
|---|---|---|
| *G02B 6/42* | (2006.01) | |
| *G02B 6/43* | (2006.01) | |
| *G02B 6/30* | (2006.01) | |
| *G02B 6/122* | (2006.01) | |
| *H05K 1/02* | (2006.01) | |

(52) U.S. Cl.
CPC ............... *G02B 6/43* (2013.01); *G02B 6/122* (2013.01); *G02B 6/30* (2013.01); *G02B 6/4206* (2013.01); *H05K 1/0274* (2013.01)

(58) Field of Classification Search
CPC .......... G02B 6/43; G02B 6/4206; G02B 6/30; G02B 6/122; H05K 1/0274
See application file for complete search history.

(56) References Cited

U.S. PATENT DOCUMENTS

| | | | |
|---|---|---|---|
| 7,212,713 B2 | 5/2007 | Fukuzawa et al. | |
| 7,538,358 B2 * | 5/2009 | Badehi ................. | G02B 6/3897 257/98 |
| 7,668,414 B2 * | 2/2010 | Shemi .................... | G02B 6/125 385/14 |
| 7,697,800 B2 | 4/2010 | Cho et al. | |
| (Continued) | | | |

FOREIGN PATENT DOCUMENTS

WO      2015071903 A1      5/2015

OTHER PUBLICATIONS

Wang et al.; "3D printed fiber optic faceplates by custom controlled fused deposition modeling;" Research Article; vol. 26, No. 12; Jun. 11, 2018; Optics Express 15362; pp. 1-15.

(Continued)

*Primary Examiner* — Ryan A Lepisto
(74) *Attorney, Agent, or Firm* — Allen, Dyer, Doppelt + Gilchrist, P.A. Attorneys at Law

(57) ABSTRACT

An opto-electronic (OE) device may include an optical fiber including a core and a cladding surrounding the core. The optical fiber may have a recess therein defining a circuit component attachment area. The OE device may include an electrically conductive circuit pattern on the circuit component attachment area and an active OE circuit component on the circuit component attachment area, optically coupled to the optical fiber, and electrically coupled to the electrically conductive circuit pattern. The OE device may further include a protective body surrounding the optical fiber and the active OE circuit component, and electrical conductors (Continued)

integrally formed with the electrically conductive circuit pattern, extending through the protective body, and having distal ends exposed on the protective body for external connection.

22 Claims, 4 Drawing Sheets

(56) References Cited

U.S. PATENT DOCUMENTS

| | | | | |
|---|---|---|---|---|
| 7,729,581 | B2* | 6/2010 | Rolston | G02B 6/4292 385/52 |
| 9,048,585 | B2* | 6/2015 | Lin | H01R 12/75 |
| 9,052,484 | B2* | 6/2015 | McColloch | G02B 6/428 |
| 9,864,146 | B1* | 1/2018 | Fu | G02B 6/30 |
| 10,012,807 | B2* | 7/2018 | Hoeltke | G02B 6/423 |
| 10,042,116 | B2* | 8/2018 | Ho | G02B 6/4246 |
| 10,466,432 | B2* | 11/2019 | Luo | G02B 6/43 |
| 10,598,860 | B2* | 3/2020 | Ramachandran | G02B 6/428 |
| 2009/0223044 | A1 | 9/2009 | Cho et al. | |
| 2014/0321819 | A1* | 10/2014 | Zhao | G02B 6/4274 385/93 |

OTHER PUBLICATIONS

Tang et al.; "Fabrication of Side-Polished Single Mode-Multimode-Single Mode Fiber and Its Characteristics of Refractive Index Sensing;" IEEE Journal of selected topics in quantum electronics, vol. 23; No. 2; Mar./Apr. 2017; pp. 1-8.

Sharma; "Fabrication and characterization of pH sensor based on side polished single mode optical fiber;" Physics Department, Indian Institute of Technology Delhi; New Delhi 110016, India; Jun. 2002; pp. 1-5.

Weiss et al.; "Direct 3D Nano-Printing on Optical Fiber Tip;" 2015 International Conference on Optical MEMS and Nanophotonics (OMN); Tul. 4-1; pp. 1-2.

* cited by examiner

OPTO-ELECTRONIC DEVICE INCLUDING ACTIVE CIRCUIT COMPONENT ON CIRCUIT ATTACHMENT AREA OF OPTICAL FIBER AND RELATED METHODS

TECHNICAL FIELD

The present invention relates to the field of electronics, and more particularly, to opto-electronic devices and related methods.

BACKGROUND

Current optical transmission systems use discrete packaging resulting in increased size, weight, and power (swap); and cost. Reliability and performance may also be less than desirable. A system, for example, that uses an optical fiber, optical and electronic components may be relatively expensive based upon integration cost among technologies.

U.S. Pat. No. 7,697,800 is directed to a method of manufacturing a printed circuit board in which optical waveguides are formed for transmitting optical signals together with electrical signals. The optical waveguide includes a cladding, a core embedded in the cladding that transmits optical signals, and a wiring pattern embedded in the cladding that transmits electrical signals. The wiring pattern may be embedded in the cladding by forming the wiring pattern on a separate carrier layer, stacking and pressing the cladding onto the carrier layer, and then removing the carrier layer.

SUMMARY

An opto-electronic (OE) device may include an optical fiber that includes a core and a cladding surrounding the core. The optical fiber may have a recess therein defining a circuit component attachment area. The OE device may include an electrically conductive circuit pattern on the circuit component attachment area, and an active OE circuit component on the circuit component attachment area, optically coupled to the optical fiber, and electrically coupled to the electrically conductive circuit pattern. The OE device may also include a protective body surrounding the optical fiber and the active OE circuit component, and a plurality of electrical conductors integrally formed with the electrically conductive circuit pattern, extending through the protective body, and having distal ends exposed on the protective body for external connection.

The protective body, electrically conductive circuit pattern, and plurality of electrical conductors each may include a plurality of respective successively deposited layers, for example. The optical fiber may include a single mode optical fiber.

The recess may extend into the core. The recess may define a ramp surface and a planar bottom surface coupled thereto, for example.

The active OE circuit component may include an integrated circuit, for example. The active OE circuit component may include at least one of an OE receiver, an OE transmitter, and an OE modulator, for example. The electrically conductive circuit pattern and plurality of electrical conductors may include silver.

A method aspect is directed to a method of making an opto-electronic (OE) device. The method may include forming a recess in an optical fiber that includes a core and a cladding surrounding the core. The recess defines a circuit component attachment area. The method may also include forming an electrically conductive circuit pattern on the circuit component attachment area and mounting an active OE circuit component on the circuit component attachment area to be optically coupled to the optical fiber and to be electrically coupled to the electrically conductive circuit pattern. The method may further include forming a protective body surrounding the optical fiber and the active OE circuit component, and forming a plurality of electrical conductors integrally with the electrically conductive circuit pattern to extend through the protective body, and having distal ends exposed on the protective body for external connection.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation are used to indicate similar elements in alternative embodiments.

Figure 1:
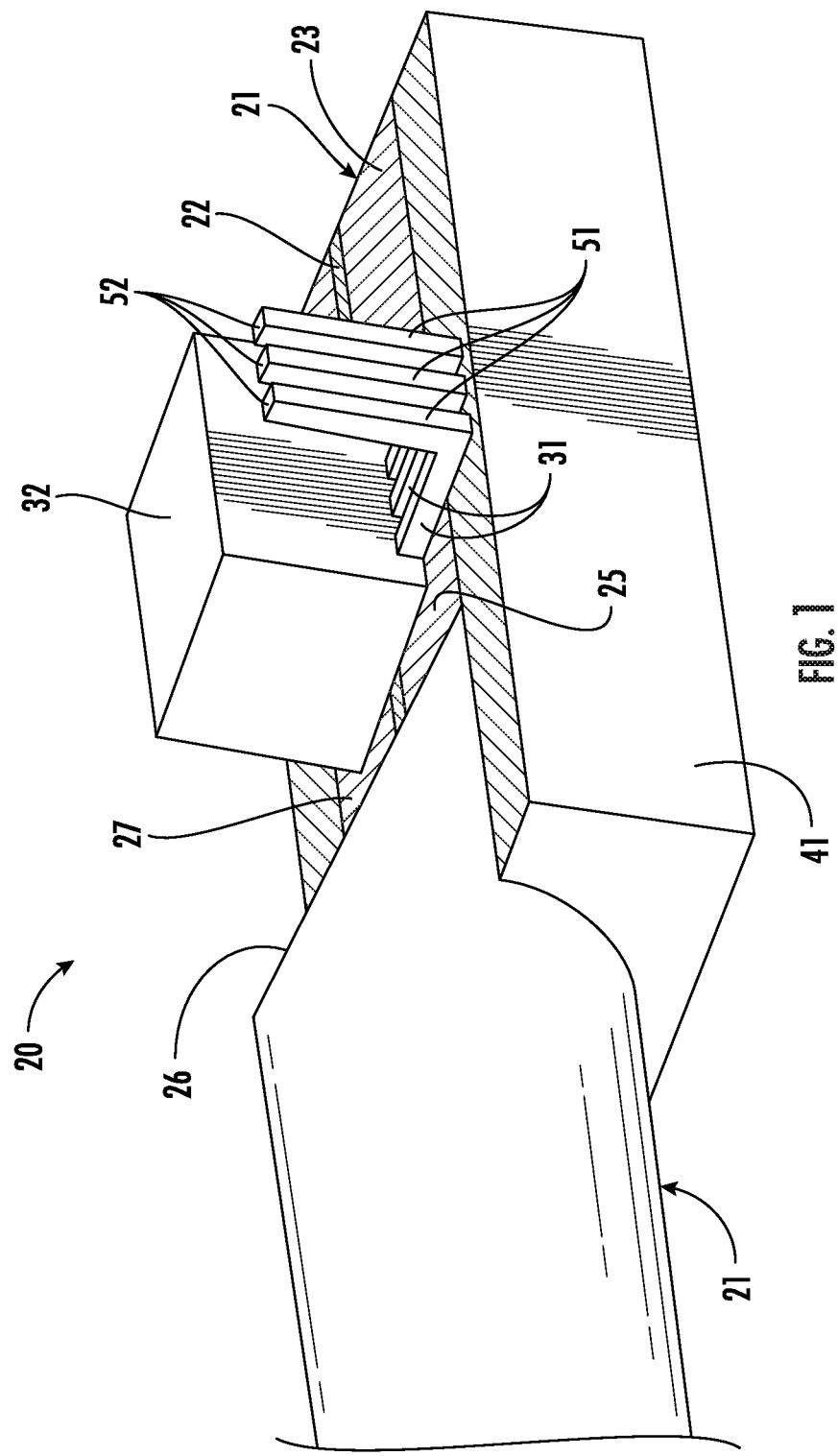
FIG. 1 is a schematic perspective view of a portion of an OE device according to an embodiment.
Figure 2:
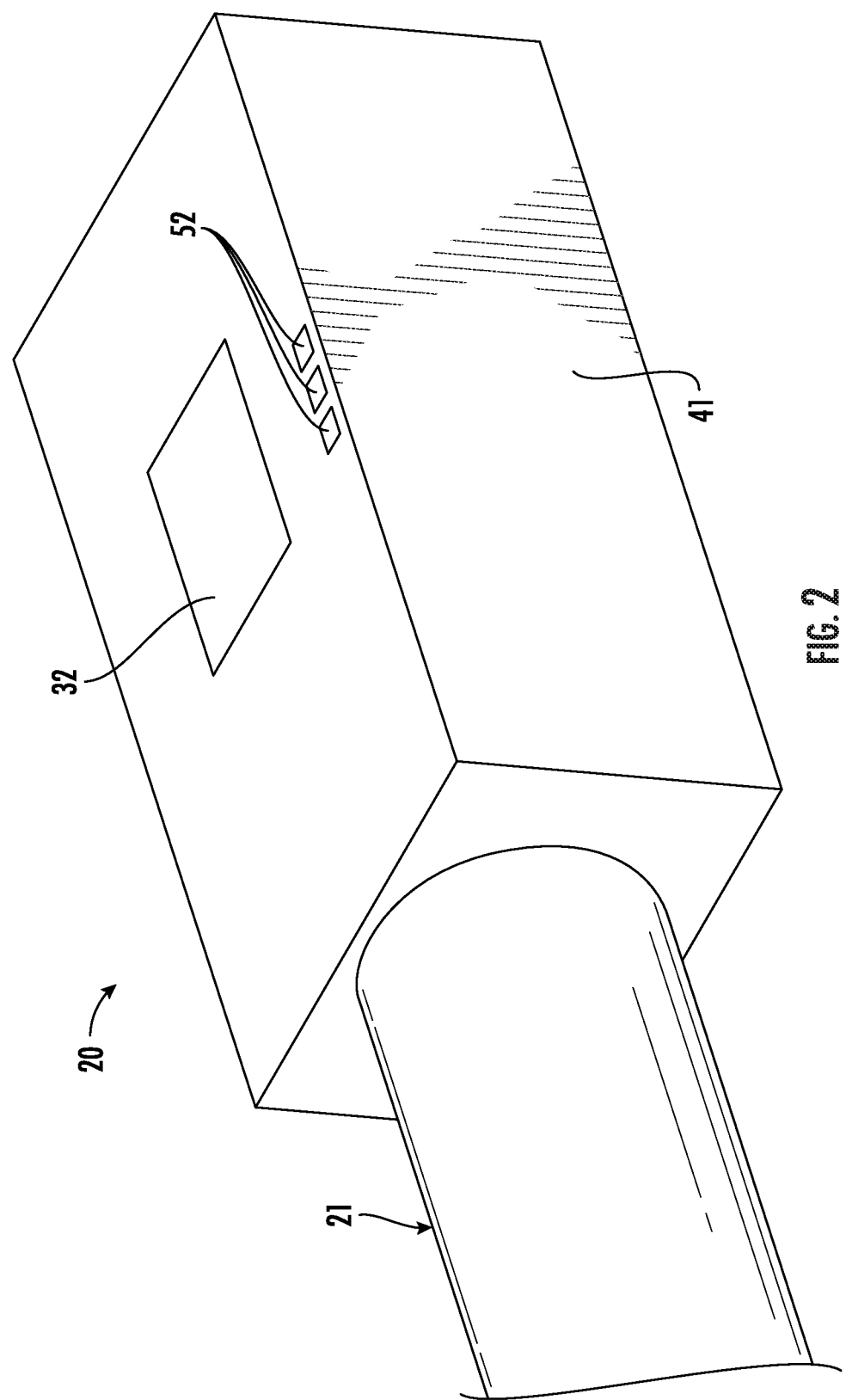
FIG. 2 is a schematic perspective view of the OE device of FIG. 1.

Referring initially to FIGS. 1-2, an opto-electronic (OE) device 20 includes an optical fiber 21, for example, a single mode optical fiber, that includes a core 22 and a cladding 23 surrounding the core. An exemplary core 22 may be about 8 microns, while an exemplary cladding 23 may be about 125 microns. In some embodiments, the optical fiber 21 may be a multi-mode fiber.

The optical fiber 21 illustratively has a recess therein defining a circuit component attachment area 25. The recess illustratively extends into the core 22 and defines a ramp surface 26 and a planar bottom surface 27 coupled to the ramp surface.

To form the recess, the desired portion of the optical fiber 21 to be recessed may be embedded in a silicate block with alignment markers, which are aligned with a 3D printer for 3D printing, as will be described below in further detail. The portion of the optical fiber 21 may be planarized to form the recess or circuit component attachment area 25.

The OE device 20 also includes an electrically conductive circuit pattern 31 on the circuit component attachment area 25. The electrically conductive circuit pattern 31 may include silver, for example, silver ink or silver nano-ink. The electrically conductive circuit pattern 31 may include other and/or additional materials. The electrically conductive circuit pattern 31 may be 3D printed on the circuit component attachment area 25, and more particularly, deposited using conductive inks, for example. An exemplary electronic circuit 3D printer that may be used to form or make the OE device 20 described herein is the Aerosol Jet 3D printer available from Optomec of Albuquerque, N. Mex.

An active OE circuit component 32 is on the circuit component attachment area 25. The active OE circuit component 32 is optically coupled to the optical fiber 21, and electrically coupled to the electrically conductive circuit pattern 31. The active OE circuit component 32 may be a non-printable component, for example, in the form of an integrated circuit (IC). More particularly, the active OE circuit component 32 may include or be in the form of any of an OE receiver, an OE transmitter, and an OE modulator. There may be more than one active OE circuit component 32.

The active OE circuit component 32 may, for example, be coupled to the electrically conductive circuit pattern 31 by solder and/or epoxy, for example. Other and/or additional techniques for coupling or securing the active OE circuit component 32 may be used, as will be appreciated by those skilled in the art.

A protective body 41 surrounds the optical fiber 21 and the active OE circuit component 32. The protective body 41 may include a dielectric material. The protective body 41 advantageously clads the exposed or active OE circuit components 32 and adjacent fiber section. Similarly to other components of the OE device 20, the protective body 41 may be 3D printed.

Electrical conductors 51 are integrally formed with the electrically conductive circuit pattern 31. The electrical conductors extend through the protective body 41 and have distal ends 52 exposed on the protective body for external connection. The electrical conductors 51 may include silver, for example. The electrical conductors 51 may include other and/or additional materials.

The protective body 41, electrically conductive circuit pattern 31, and electrical conductors 51 each may include respective successively deposited layers. In other words, the protective body 41, the electrically conductive circuit pattern 31, and the electrical conductors 51 may be deposited as layers by way of 3D printing, for example. Indeed, by embedding the active OE circuitry component 32 on the circuit component attachment area 25, and by way+of evanescent coupling, package-able optical interconnects and relatively complex circuits may be relatively easily created.

The OE device 20 may include one or more other devices on the circuit component attachment area 25. These other devices, similarly to the active OE circuit component 32, may be electrically coupled to the electrically conductive circuit pattern 31.

Figure 3:
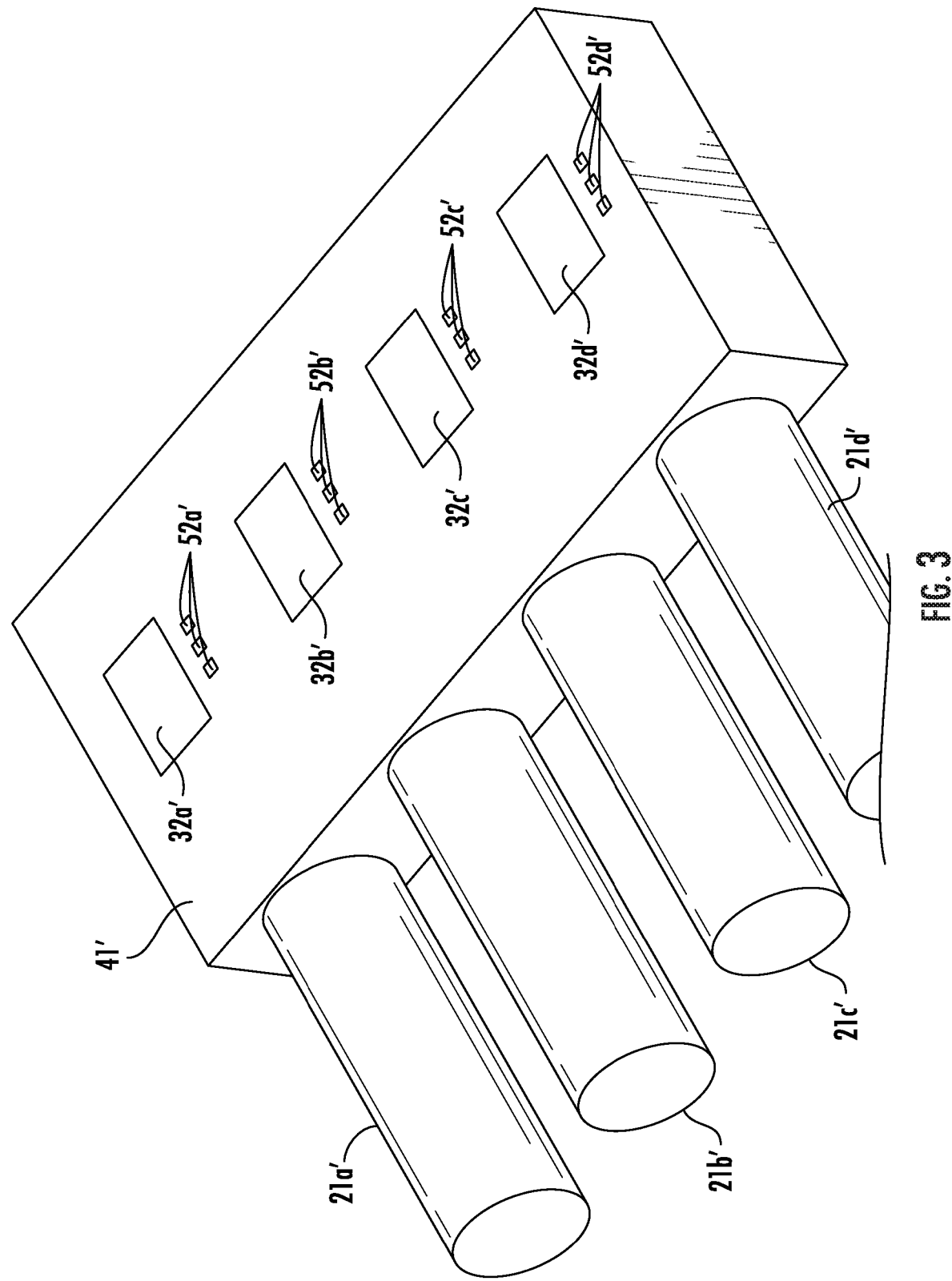
FIG. 3 is a schematic diagram of an OE device in accordance with another embodiment.

Referring now to FIG. 3, in another embodiment, a single protective body 41' surrounds a plurality of optical fibers 21a'-21d' and the active OE circuit components 32a'-32d'. More particularly, respective electrical conductors 51a'-51d' are integrally formed with each electrically conductive circuit pattern, and extend through the protective body 41'. Distal ends 52a'-52d' of the electrical conductors are exposed on the protective body 41' for external connection. Of course, many more than four optical fibers 21a'-21d' may be terminated in the single protective body 41'.

Figure 4:
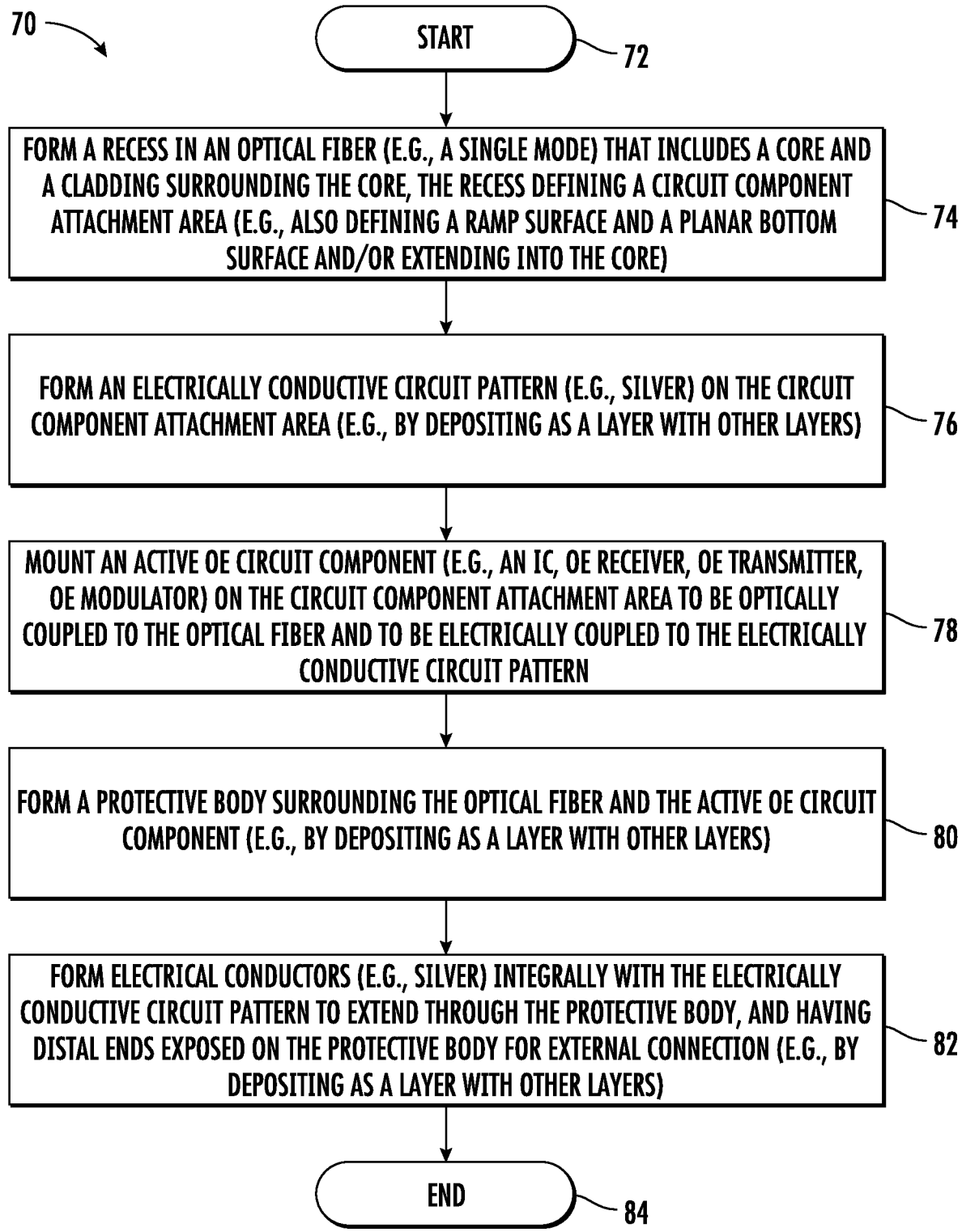
FIG. 4 is a flow diagram illustrating a method of making an OE device in accordance with an embodiment.

Referring now to the flowchart 70 in FIG. 4, beginning at Block 72, a method aspect is directed to a method of making an opto-electronic (OE) device 20 is now described. The method includes forming a recess in an optical fiber 21 that includes a core 22 and a cladding 23 surrounding the core (Block 74). The recess defines a circuit component attachment area 25. The method also includes forming an electrically conductive circuit pattern 31 on the circuit component attachment area 25 (Block 76) and mounting an active OE circuit component 32 on the circuit component attachment area to be optically coupled to the optical fiber 21 and to be electrically coupled to the electrically conductive circuit pattern (Block 78). The method further includes forming a protective body 41 surrounding the optical fiber 21 and the active OE circuit component 32 (Block 80), and forming electrical conductors 51 integrally with the electrically conductive circuit pattern 31 to extend through the protective body, and having distal ends 52 exposed on the protective body for external connection (Block 82). The method ends at Block 84.

While several embodiments have been described herein, it should be appreciated by those skilled in the art that any element or elements from one or more embodiments may be used with any other element or elements from any other embodiment or embodiments. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An opto-electronic (OE) device comprising:
  an optical fiber comprising a core and a cladding surrounding the core, the optical fiber having a recess therein defining a circuit component attachment area;
  an electrically conductive circuit pattern on the circuit component attachment area;
  an active OE circuit component on the circuit component attachment area, optically coupled to the optical fiber, and electrically coupled to the electrically conductive circuit pattern;
  a protective body surrounding the optical fiber and the active OE circuit component; and
  a plurality of electrical conductors integrally formed with the electrically conductive circuit pattern, extending through the protective body, and having distal ends exposed on the protective body for external connection.

2. The OE device of claim 1 wherein the protective body, electrically conductive circuit pattern, and plurality of electrical conductors each comprises a plurality of respective successively deposited layers.

3. The OE device of claim 1 wherein the optical fiber comprises a single mode optical fiber.

4. The OE device of claim 1 wherein the recess extends into the core.

5. The OE device of claim 1 wherein the recess defines a ramp surface and a planar bottom surface coupled thereto.

6. The OE device of claim 1 wherein the active OE circuit component comprises an integrated circuit.

7. The OE device of claim 6 wherein the active OE circuit component comprises at least one of an OE receiver, an OE transmitter, and an OE modulator.

8. The OE device of claim 1 wherein the electrically conductive circuit pattern and plurality of electrical conductors comprise silver.

9. An opto-electronic (OE) device comprising:
  a plurality of optical fibers, each optical fiber comprising a core and a cladding surrounding the core, and each optical fiber having a recess therein defining a circuit component attachment area;
  a respective electrically conductive circuit pattern on the circuit component attachment area of each optical fiber;
  a respective active OE circuit component on the circuit component attachment area of each optical fiber, optically coupled to each optical fiber, and electrically coupled to the electrically conductive circuit pattern of each optical fiber;

a protective body surrounding the plurality of optical fibers and active OE circuit components; and a respective plurality of electrical conductors integrally formed with each electrically conductive circuit pattern, extending through the protective body, and having distal ends exposed on the protective body for external connection.

10. The OE device of claim 9 wherein the protective body, plurality of electrically conductive circuit patterns, and plurality of electrical conductors each comprises a plurality of respective successively deposited layers.

11. The OE device of claim 9 wherein each optical fiber comprises a single mode optical fiber.

12. The OE device of claim 9 wherein each recess extends into the core.

13. The OE device of claim 9 wherein each recess defines a ramp surface and a planar bottom surface coupled thereto.

14. The OE device of claim 9 wherein each active OE circuit component comprises an integrated circuit.

15. The OE device of claim 9 wherein the plurality of optical fibers are arranged in side-by-side relation within the protective body.

16. A method for making an opto-electronic (OE) device comprising:

forming a recess in an optical fiber comprising a core and a cladding surrounding the core, the recess defining a circuit component attachment area;

forming an electrically conductive circuit pattern on the circuit component attachment area;

mounting an active OE circuit component on the circuit component attachment area to be optically coupled to the optical fiber and to be electrically coupled to the electrically conductive circuit pattern;

forming a protective body surrounding the optical fiber and the active OE circuit component; and forming a plurality of electrical conductors integrally with the electrically conductive circuit pattern to extend through the protective body, and having distal ends exposed on the protective body for external connection.

17. The method of claim 16 wherein forming the protective body, electrically conductive circuit pattern, and plurality of electrical conductors comprises successively depositing a plurality of respective layers.

18. The method of claim 16 wherein the optical fiber comprises a single mode optical fiber.

19. The method of claim 16 wherein the recess extends into the core.

20. The method of claim 16 wherein the recess defines a ramp surface and a planar bottom surface coupled thereto.

21. The method of claim 16 wherein the active OE circuit component comprises an integrated circuit.

22. The method of claim 21 wherein the active OE circuit component comprises at least one of an OE receiver, an OE transmitter, and an OE modulator.

* * * * *